United States Patent
Chen et al.

(10) Patent No.: US 9,331,277 B2
(45) Date of Patent: May 3, 2016

(54) ONE TRANSISTOR AND ONE RESISTIVE RANDOM ACCESS MEMORY (RRAM) STRUCTURE WITH SPACER

(71) Applicant: Taiwan Semiconductor Manufacturing Company, Ltd., Hsin-Chu (TW)

(72) Inventors: Hsia-Wei Chen, Taipei (TW); Wen-Ting Chu, Kaohsiung (TW); Kuo-Chi Tu, Hsin-Chu (TW); Chin-Chieh Yang, Taipei (TW); Chih-Yang Chang, Yuanlin Township (TW); Yu-Wen Liao, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 166 days.

(21) Appl. No.: 13/746,187

(22) Filed: Jan. 21, 2013

(65) Prior Publication Data

US 2014/0203236 A1    Jul. 24, 2014

(51) Int. Cl.
| | |
|---|---|
| *H01L 47/00* | (2006.01) |
| *H01L 21/20* | (2006.01) |
| *H01L 45/00* | (2006.01) |
| *H01L 27/24* | (2006.01) |

(52) U.S. Cl.
CPC ............ *H01L 45/16* (2013.01); *H01L 27/2436* (2013.01); *H01L 45/04* (2013.01); *H01L 45/12* (2013.01); *H01L 45/1233* (2013.01); *H01L 45/146* (2013.01); *H01L 45/1675* (2013.01)

(58) Field of Classification Search
CPC . H01L 45/16; H01L 45/1233; H01L 27/2436; H01L 45/1675; H01L 45/12; H01L 45/04; H01L 45/146

USPC ............... 257/4, E27.004, E45.002; 438/382
See application file for complete search history.

(56) References Cited

U.S. PATENT DOCUMENTS

| | | |
|---|---|---|
| 6,677,637 B2 | 1/2004 | Bernstein et al. |
| 6,737,728 B1 | 5/2004 | Block et al. |
| 6,781,185 B2 | 8/2004 | Chen et al. |
| 6,803,641 B2 | 10/2004 | Papa Rao et al. |
| 6,849,891 B1 | 2/2005 | Hsu et al. |
| 6,936,881 B2 | 8/2005 | Yeo et al. |
| 6,937,457 B2 | 8/2005 | Shih et al. |
| 6,940,705 B2 | 9/2005 | Yeo et al. |
| 7,195,970 B2 | 3/2007 | Tu et al. |
| 7,407,858 B2 | 8/2008 | Li et al. |

(Continued)

OTHER PUBLICATIONS

Wong, H.-S., et al., "Metal-Oxide RRAM," Proceedings of the IEEE, vol. 100, No. 6, Jun. 2012, 20 pages.

*Primary Examiner* — Fernando L Toledo
*Assistant Examiner* — Aaron Gray
(74) *Attorney, Agent, or Firm* — Slater & Matsil, L.L.P.

(57) ABSTRACT

The present disclosure provides a resistive random access memory (RRAM) cells and methods of making the same. The RRAM cell includes a transistor and an RRAM structure. The RRAM structure includes a bottom electrode having a via portion and a top portion, a resistive material layer on the bottom electrode having a width that is same as a width of the top portion of the bottom electrode; a capping layer over the bottom electrode; a spacer surrounding the capping layer; and, a top electrode on the capping layer having a smaller width than the resistive material layer. The RRAM cell further includes a conductive material connecting the top electrode of the RRAM structure to a metal layer.

20 Claims, 10 Drawing Sheets

(56) References Cited

U.S. PATENT DOCUMENTS

| | | |
|---|---|---|
| 7,557,399 B2 | 7/2009 | Tu et al. |
| 8,000,128 B2 | 8/2011 | Li et al. |
| 8,009,454 B2 | 8/2011 | Lee et al. |
| 2006/0289848 A1* | 12/2006 | Dennison ............ 257/3 |
| 2007/0173019 A1* | 7/2007 | Ho et al. ............ 438/257 |
| 2008/0094875 A1* | 4/2008 | Ho et al. ............ 365/148 |
| 2010/0261329 A1* | 10/2010 | Lung ............ 438/381 |
| 2011/0001108 A1* | 1/2011 | Greene et al. ............ 257/2 |
| 2011/0272660 A1* | 11/2011 | Wells ............ 257/4 |
| 2012/0012807 A1* | 1/2012 | Yamaguchi et al. ............ 257/4 |

* cited by examiner

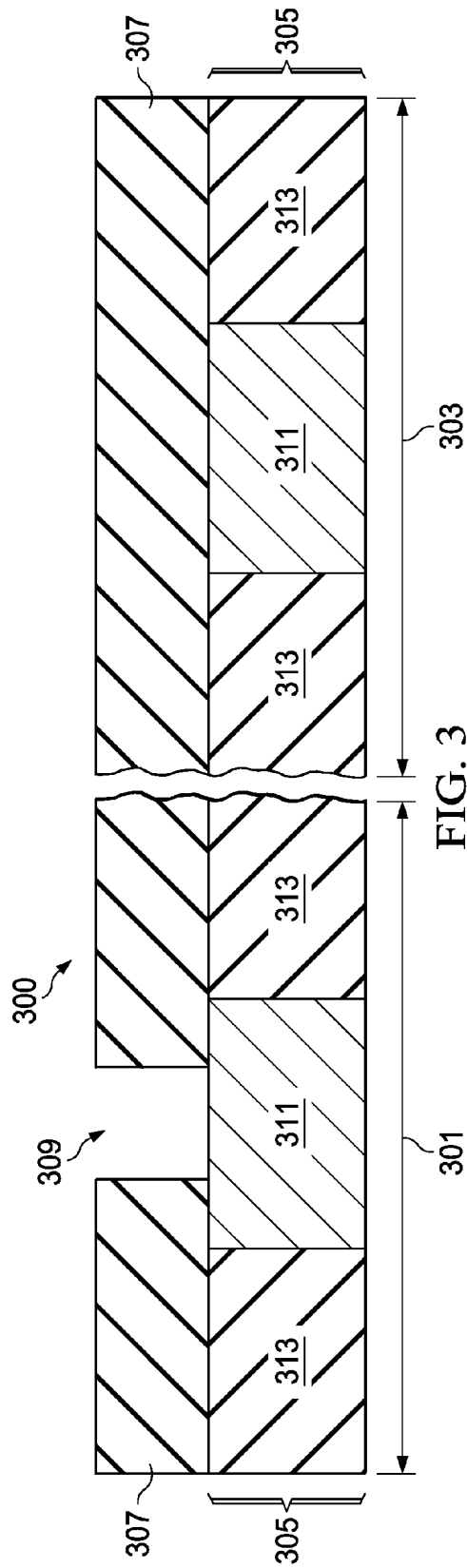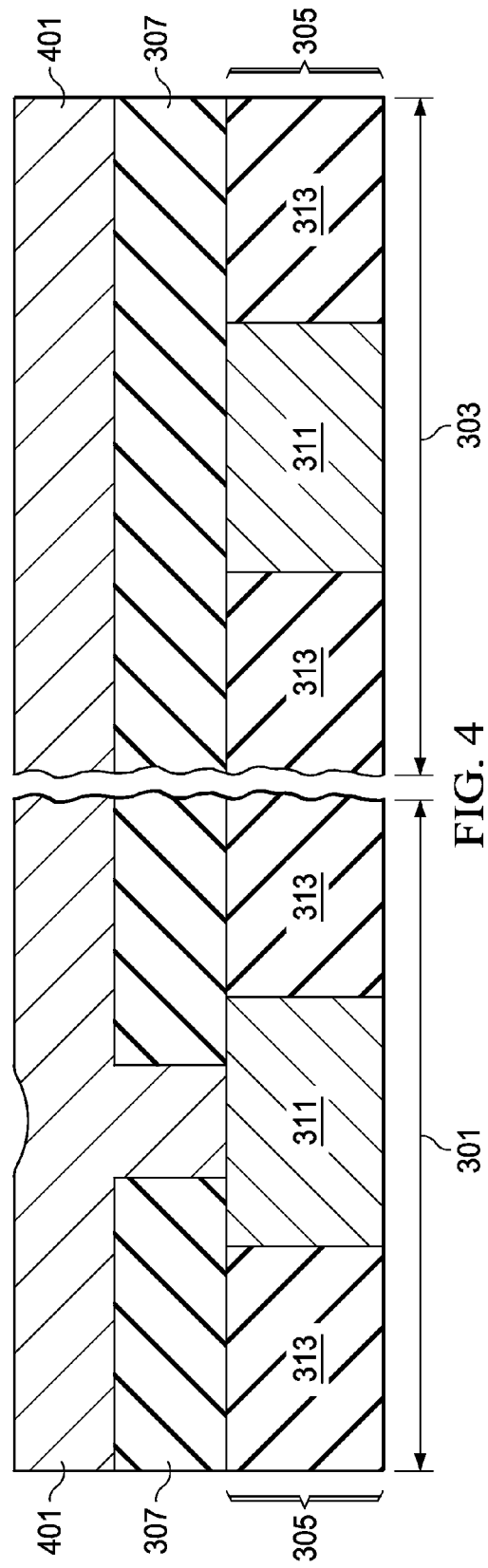

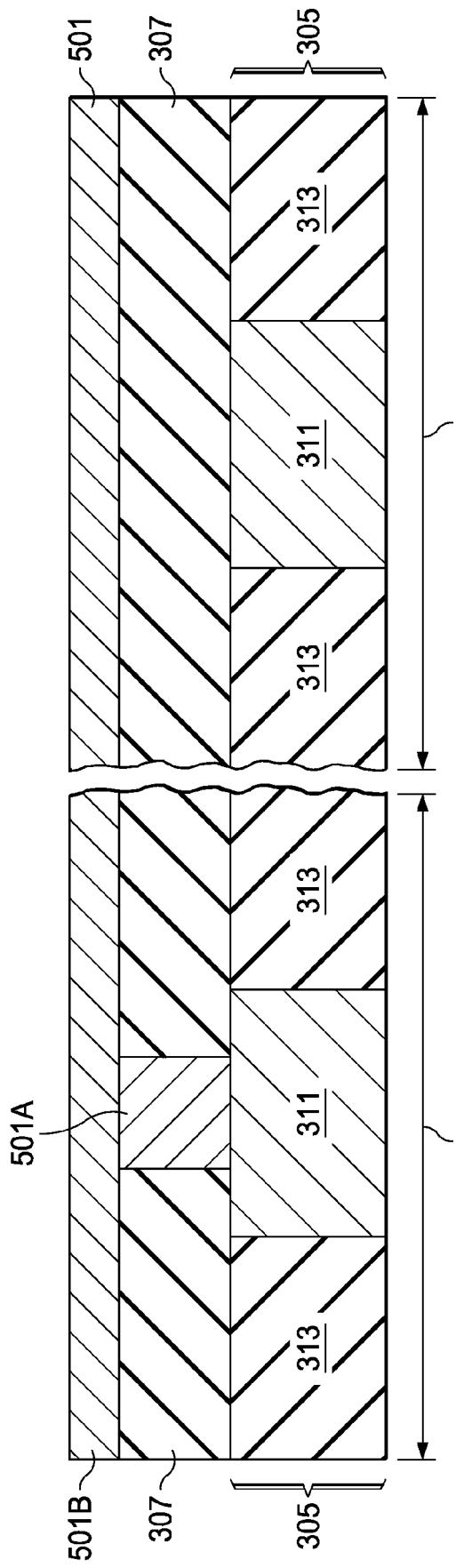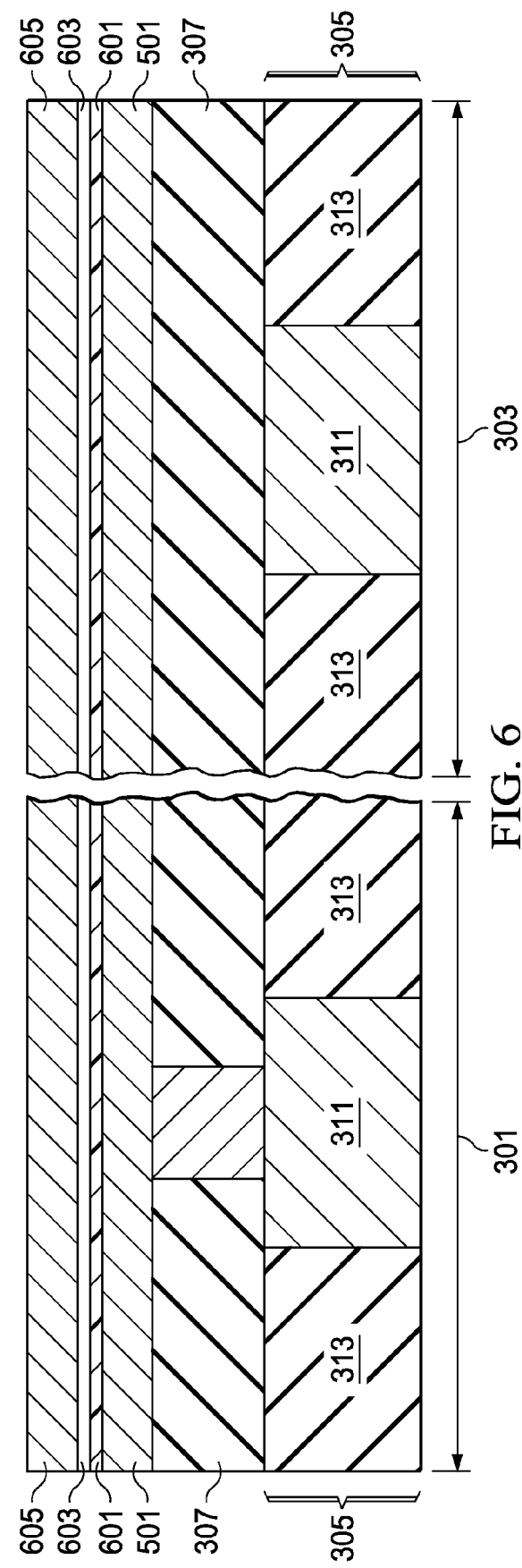

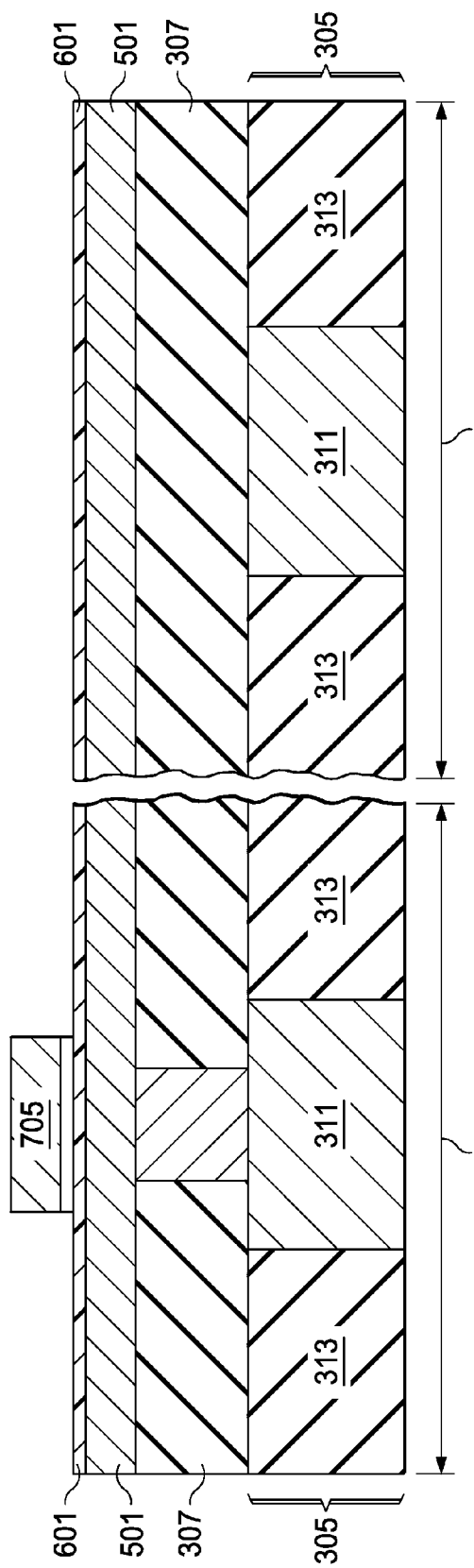
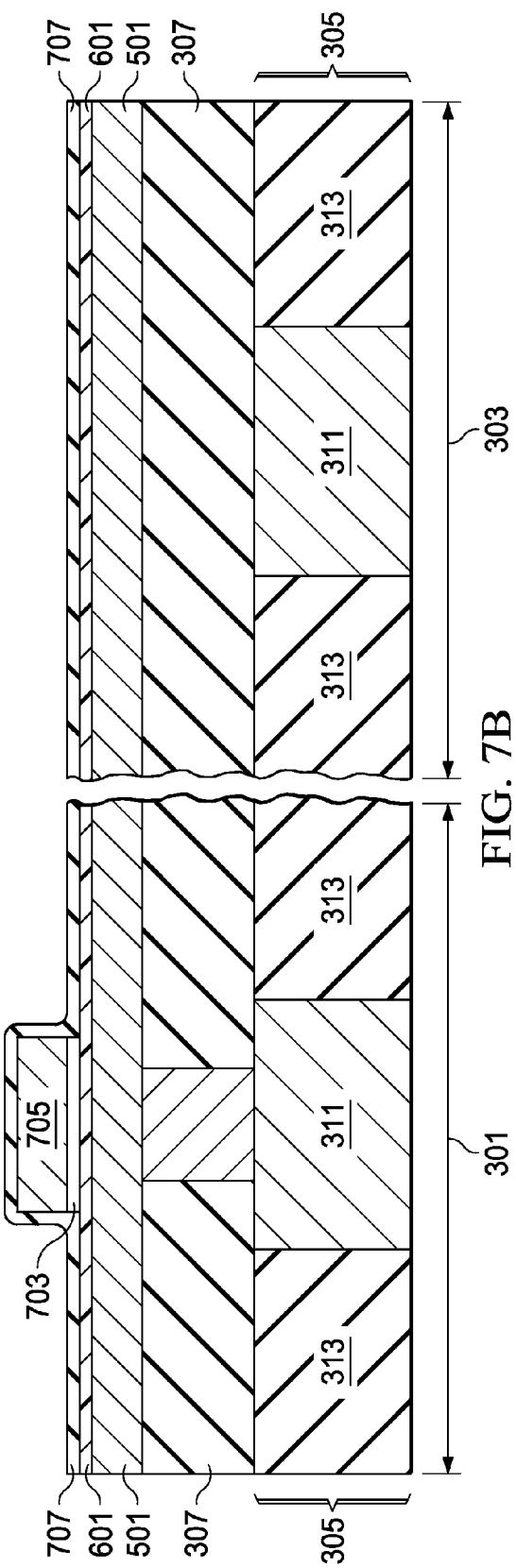
FIG. 7A
FIG. 7B

ONE TRANSISTOR AND ONE RESISTIVE RANDOM ACCESS MEMORY (RRAM) STRUCTURE WITH SPACER

FIELD

The disclosure relates to semiconductor devices and, more particularly, to resistive random-access memory (RRAM) device structures and methods for making the RRAM devices.

BACKGROUND

In integrated circuit (IC) devices, resistive random access memory (RRAM) is an emerging technology for next generation non-volatile memory devices. RRAM is a memory structure including an array of RRAM cells each of which stores a bit of data using resistance values, rather than electronic charge. Particularly, each RRAM cell includes a resistive material layer, the resistance of which can be adjusted to represent logic "0" or logic "1." RRAM devices operate under the principle that a dielectric, which is normally insulating, can be made to conduct through a filament or conduction path formed after the application of a sufficiently high voltage. The forming of a filament or conduction path is the forming operation or forming process of the RRAM. The sufficiently high voltage is the 'form' voltage. The conduction path formation can arise from different mechanisms, including defect, metal migration, and other mechanisms. Various different dielectric materials may be used in RRAM devices. Once the filament or conduction path is formed, it may be reset, i.e. broken, resulting in high resistance or set, i.e. re-formed, resulting in lower resistance, by an appropriately applied voltage. There are various architectures to configure an array of RRAM cells. For example, a cross-point architecture include a RRAM in each cell configured between crossed a word line and a bit line. Recently, a transistor type architecture pairs a RRAM with a transistor (1T1R) in each cell is proposed that can improve random access time. However, initial proposals result in an inefficient device with significant leakage current. Thus, improvements in 1T1R RRAM cell and method of manufacturing continue to be sought.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 3-6, 7A-7C, 8-11 are cross sectional diagrams of a partially fabricated RRAM structure in various stages of fabrication in accordance with various embodiments of the present disclosure.

DETAILED DESCRIPTION

Figure 1A:
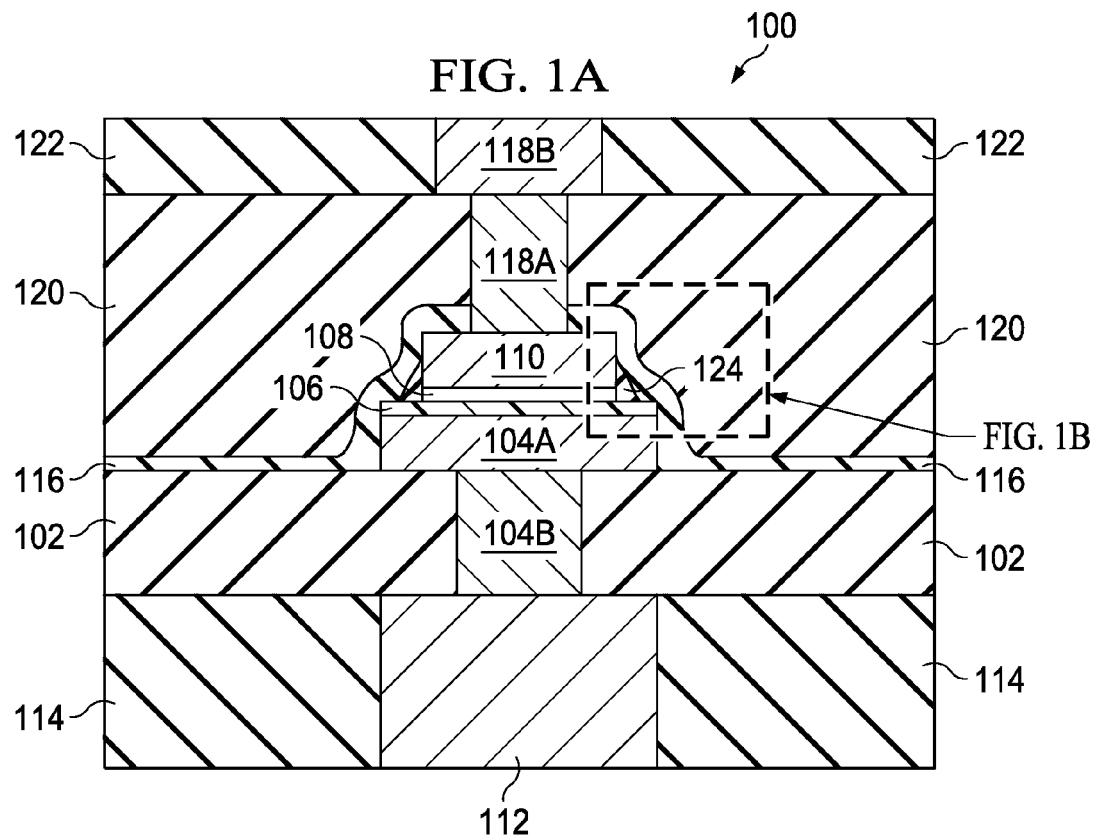
FIGS. 1A and 1B are a cross sectional views of a resistive random access memory (RRAM) structure in accordance with various embodiments of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below.

FIG. 1A is a cross sectional view of a resistive random access memory (RRAM) structure embedded in a multilevel interconnect (MLI) structure over a transistor in accordance with various embodiments of the present disclosure. The RRAM structure 100 includes a bottom electrode 104A/B in and over a RRAM stop layer 102, a resistive material layer 106, a capping layer 108, a spacer 124 around the capping layer, and a top electrode 110. The bottom electrode is composed of two portions, a via portion 104B embedded in the RRAM stop layer 102 and a top portion 104A over the via portion and the RRAM stop layer 102. A metal/dielectric layer is disposed below the RRAM stop layer 102 and includes one or more metal features 112 embedded in dielectric layer 114. The capping layer 108 is disposed between the top electrode 110 and the resistive material layer 106. A spacer 124 surrounds the capping layer 108 covers all of the capping layer sidewalls and a portion of the top electrode 110 sidewalls. A second RRAM stop layer 116 covers the top electrode 110, spacer 124, resistive material layer 106, and top portion 104A of the bottom electrode. A contact material having two portions: a via contact 118A and a metal feature 118B electrically connects to the top electrode 110 through the second RRAM stop layer 116. A dielectric material 120 fills the regions between RRAM structures 100 over the second RRAM stop layer 116. Another dielectric material 122 is disposed over the dielectric material 120 and the metal feature 118B is embedded therein. The dielectric material 120 may be formed of the same material as the dielectric material 122 and also dielectric layer 114.

Figure 1B:
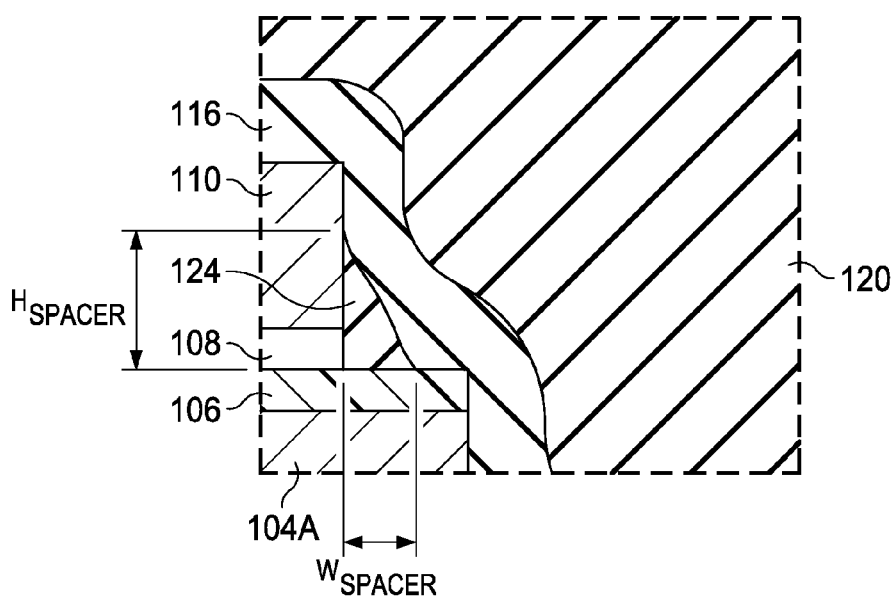

As shown in FIG. 1A, the widths of some of the features of the RRAM structures are different. The top electrode 110 has a width that is smaller than the width of the bottom electrode 104A. The capping layer 108 has the same width as the top electrode 110. The resistive material layer 106 may have the same width as the bottom electrode 104A. FIG. 1B is a more detailed cross section view of the spacer 124 of FIG. 1A. The spacer 124 surrounding the capping layer 108 has a height $H_{spacer}$ (extent of sidewall coverage) and a width $W_{spacer}$ (extent of resistive material layer coverage on one side). The height $H_{spacer}$ is greater than the width $W_{spacer}$. In some embodiments, $H_{spacer}$ is about two times the $W_{spacer}$.

The spacer 124 protects the capping layer during bottom electrode etching and reduces or prevents sidewall damage at the capping layer and the top electrode. When compounded with a thin or broken resistive material layer, such sidewall damage can form a leakage path that can lead to cell leakage.

The spacer 124 effectively passivates the corner region of where the capping layer 108 and the resistive material layer 106 meet and prevent a leakage path from forming.

The RRAM structure 100 has two or more states with different electric resistance values that correspond to a different digital value. The RRAM structure 100 switches from one state to another by applying a predetermined voltage or current to the RRAM structure 100. For example, the RRAM structure 100 has a state of relatively high resistance, referred to as "a high resistance state", and a state of relatively low resistance, referred to as "a low resistance state". The RRAM structure 100 may be switched from the high resistance state to the low resistance state, or from the low resistance state to high resistance state by applying a predetermined voltage or current to the electrodes.

In a memory bit cell having one transistor and one RRAM (1T1R) the bottom electrode 104A/B is electrically connected to a drain electrode of a transistor through the MLI. In some embodiments, the RRAM structure is placed between the fourth metal layer (M4) and the fifth metal layer (M5). In other embodiments, the RRAM structure is placed between other metal layers. In still other embodiments, the RRAM structure is placed more than once between more than metal layers. The RRAM structure may be placed more than once when the footprint of the RRAM is larger than that of the corresponding transistor so that a one transistor one RRAM match cannot be made in one layer of RRAM.

The bottom electrode 104A/B may be made of gold (Au), platinum (Pt), ruthenium (Ru), iridium (Ir), titanium (Ti), aluminum (Al), copper (Cu), tantalum (Ta), tungsten (W), iridium-tantalum alloy (Ir—Ta) or indium-tin oxide (ITO), or any alloy, oxide, nitride, fluoride, carbide, boride or silicide of these, such as TaN, TiN, TiAlN, TiW, or combinations thereof. The thickness of the bottom electrode 104 may be between a range about 100-500 nm. In some embodiments, the bottom electrode includes a via portion and a top portion. The via portion may include one or more layers and may be a conductive barrier material to a metal feature below. The top portion may also include one or more layers. In one embodiment, the bottom electrode includes a tantalum nitride layer and a titanium nitride layer.

A resistive material layer 106 is formed on the bottom electrode 104 and directly contacts to the bottom electrode 104. The thickness of the resistive material layer 106 may be between a range about 20-100 nm. The resistive material layer may include one or more oxide of W, Ta, Ti, Ni, Co, Hf, Ru, Zr, Zn, Fe, Sn, Al, Cu, Ag, Mo, Cr. In some cases, silicon may be included to form a composite material. In some embodiments, hafnium oxide and/or zirconium oxide is used.

A top electrode 110 is formed over the resistive material layer 106. The top electrode 110 may be formed from materials such as gold (Au), platinum (Pt), ruthenium (Ru), iridium (Ir), titanium (Ti), aluminum (Al), copper (Cu), tantalum (Ta), tungsten (W), iridium-tantalum alloy (Ir—Ta) or indium-tin oxide (ITO), or any alloy, oxide, nitride, fluoride, carbide, boride or silicide of these, such as TaN, TiN, TiAlN, TiW, or combinations thereof. The thickness of the top electrode 110 may be between a range about 100-500 nm.

An 1T1R memory cell is controlled through at least four electrical connections to read, write, and form the memory cell. A gate contact to the transistors control a gate voltage that allows a channel region to conduct. A body contact may be used to connect to the semiconductor substrate and provide a ground or bias the transistor. A source line contact is connected to the top electrode 110; and, a bit line contact is connected to the source region contact of the transistor.

During memory cell 'form' operation, a specified voltage is conducted across the RRAM structure between the bottom electrode 104A/B and the top electrode 110. The voltage is provided through the transistor from the bit line contact across to the source line contact. The 'form' voltage is usually a different voltage from the voltage used to read and write the memory cell and is usually at a higher absolute value or has a different polarity. In one example, the voltage difference may be 3 volts or greater, or about 5 volts. During the 'form' operation, a bias may be provided via the body contact. In some embodiments, the 'form' voltage is provided directly through the MLI while bypassing the transistor associated with the memory cell. If polymer residues from the bottom electrode etching and damages to the top surface of the resistive material layer 106 provide a conducting path, current may leak through this path instead of causing the formation of filaments across the resistive material layer 106. However, with the spacer 124, which may also be referred to as the protective layer, the existence of polymer residues and damages to the top surface of the resistive material layer 106 close to the capping layer 108 sidewall are minimized and no such leakage path is created.

After the 'form' operation, one or more filament conductors are disposed across the resistive material layer 106. The resistance across the resistive material layer 106 is at a low value and a high current may be passed when the transistor is selected. During the write operation, the one or more filament conductors are broken by passing a voltage different from the 'form' voltage. In some embodiments, the 'write' voltage may have a different polarity than the 'form' voltage. In one example, the voltage difference is about 1 volt. After the one or more filament conductors are broken, the resistance across the resistive material layer 106 is at a high value a low current or no current may be passed when the transistor is selected. Subsequent write operation applies yet a different voltage that is less than the 'form' voltage to reconnect the broken filament conductors. By changing the filament conductors, a high or low resistance is stored in the memory cell that does not change when the power is removed. Either the high resistance or the low resistance may be read as a "0" or "1", respectively. During a read operation, a 'read' voltage is applied across the RRAM structure. In some examples, the 'read' voltage is between about 0.3 volts to about 0.5 volts. The 'read' voltage is much smaller than the 'write' voltage to avoid inadvertent writing of the memory cell to a different value.

A memory cell is usually connected to an array of memory cells either embedded in a logic device or as a stand-alone memory device. Memory cell arrays are organized into bit lines and word lines. The bit line contact is connected to the bit line of the memory cell array and the gate contact is connected to the word line of the memory cell array.

Figure 2:
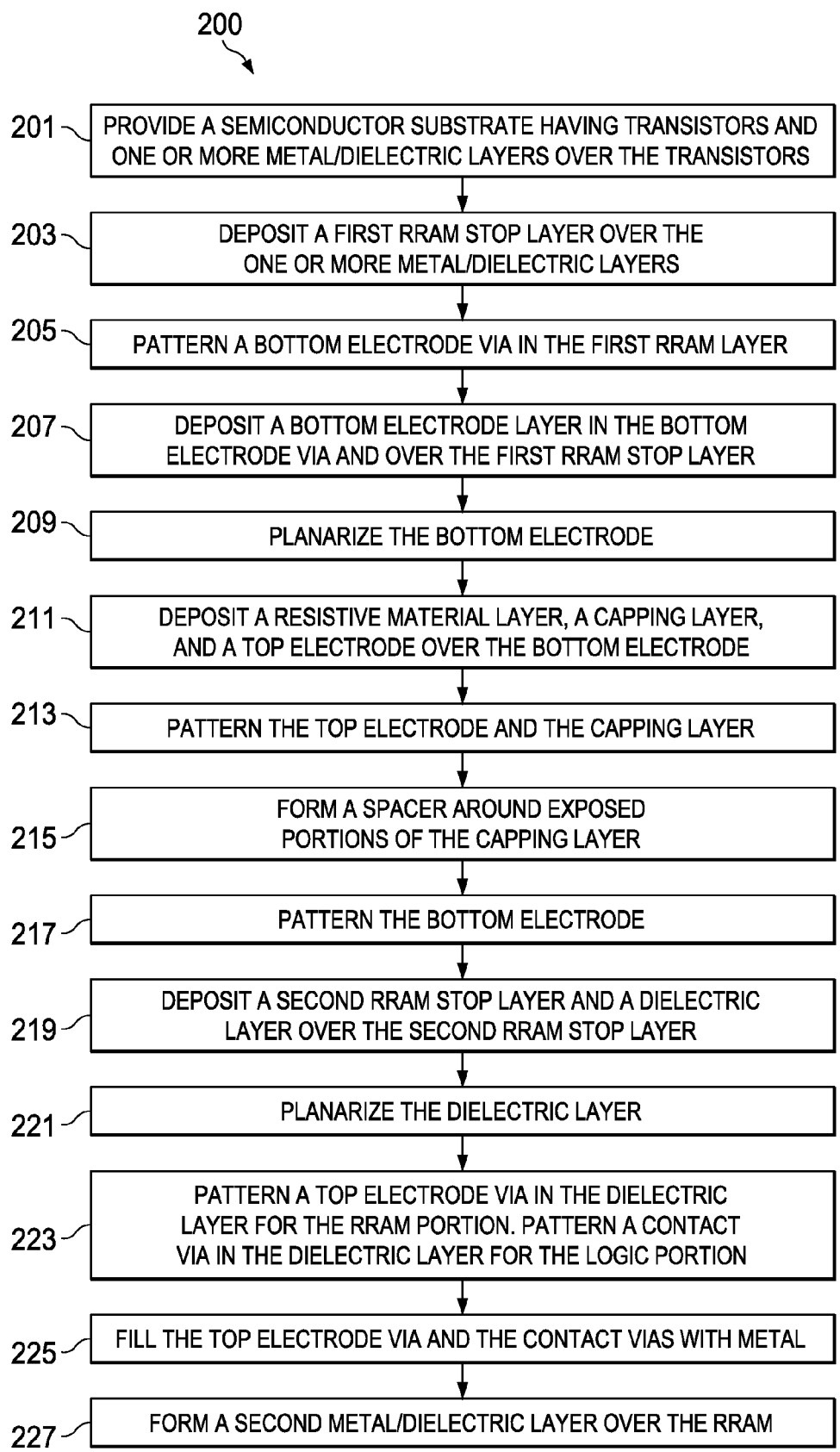
FIG. 2 is a flowchart of a method making of a RRAM cell according to aspects of the present disclosure in various embodiments.

FIG. 2 is a flowchart of a method 200 for making a memory device according to aspects of the present disclosure in various embodiments. Various operations of the method 200 are discussed in association with cross-section diagrams 3-11. In operation 201 of method 200, a semiconductor substrate having transistors and one or more metal/dielectric layers over the transistors is provided. The semiconductor substrate may be a silicon substrate. Alternatively, the substrate may comprise another elementary semiconductor, such as germanium; a compound semiconductor including silicon carbide; an alloy semiconductor including silicon germanium; or combinations thereof. In some embodiments, the substrate is a semiconductor on insulator (SOI) substrate. The substrate may include doped regions, such as p-wells and n-wells. In the present disclosure, a wafer is a workpiece that includes a semiconductor substrate and various features formed in and over and attached to the semiconductor substrate. The wafer may be in various stages of fabrication and is processed using the CMOS process. The transistors are formed by known transistor fabrication processes and may be a planar transistor, such as polysilicon gate transistors or high-k metal gate transistors, or a multi-gate transistor, such as fin field effect transistors. After the transistors are formed, one or more metal/dielectric layers of a multi-level interconnect (MLI) is formed over the transistors. According to some embodiments, four metal/dielectric layers are formed over the transistors.

In operation 203, a first RRAM stop layer is deposited over the one or more metal/dielectric layers. The first RRAM stop layer may be silicon carbide, silicon oxynitride, silicon nitride, carbon doped silicon nitride or carbon doped silicon oxide. The first RRAM stop layer is selected to have a different etch selectivity than the bottom electrode material. Another selection criterion is the design requirements of the logic device portion (portion 303 of FIGS. 3-11). The first RRAM stop layer is deposited over a planarized metal/dielectric layer using a chemical vapor deposition (CVD) process such as plasma enhanced (PE) CVD, high-density plasma (HDP) CVD, inductively-coupled-plasma (ICP) CVD, or thermal CVD.

In operation 205, a bottom electrode via is patterned in the first RRAM stop layer. The bottom electrode via is formed by first depositing a photoresist over the first RRAM stop layer, exposing a portion of the photoresist to a radiation, developing the photoresist, and etching the bottom electrode via in the first RRAM stop layer using the photoresist as an etch mask. In some embodiments, a bottom electrode having only one section may be used. For example, the entire bottom electrode may be embedded in the first RRAM stop layer. In such embodiments, the bottom electrode via is patterned to have the width of the bottom electrode, which may be larger or smaller than a width of the metal feature below.

FIG. 3 is a cross section diagram of portions of a wafer after operation 205. The wafer 300 includes a RRAM portion 301 and a logic device portion 303. Various operations of method 200 is performed in the RRAM portion 301 and conventional MLI formation is performed in the logic device portion 303. The transistor and metal/dielectric layers below the RRAM level are not shown. The cross section of FIG. 3 includes a metal/dielectric layer 305 including both metal feature 311 and dielectric material 313. A first RRAM stop layer 307 is deposited over the metal/dielectric layer 305 for both the RRAM portion 301 and the logic device portion 303. A bottom electrode via 309 is formed in the first RRAM stop layer 307 over the metal feature 311 in the RRAM portion 301.

Referring back to FIG. 2, in operation 207, a bottom electrode layer is deposited in the bottom electrode via and over the first RRAM stop layer. The bottom electrode layer may be tantalum nitride, titanium nitride, tungsten, or copper deposited using a physical vapor deposition (PVD) process or a plating process. In some cases, a liner or a barrier layer may be deposited first, followed by a deposition of the bulk material using one of the known deposition methods. Because the bottom electrode layer deposition fills the bottom electrode via and covers the first RRAM stop layer, the portion of the bottom electrode layer over the bottom electrode via may have different thickness above the bottom electrode via as compared to the bottom electrode layer not over the bottom electrode via. FIG. 4 is a cross section diagram of portions of a wafer after operation 207 including a bottom electrode layer 401 over the first RRAM stop layer. As shown in FIG. 4, a top surface of the bottom electrode layer 401 may be uneven over the bottom electrode via.

Referring back to FIG. 2, in operation 209 the bottom electrode is planarized. The planarization is performed with a chemical mechanical polishing (CMP) process. The planarization is tuned to minimize thickness variations of the top portion of the bottom electrode. Referring to FIG. 5, the bottom electrode layer 501 includes a top portion 501A and via portion 501B. After the planarization, the top surface of the bottom electrode layer portion 501A is planar and the dishing shown in FIG. 4 disappears. The high uniformity of the top portion 501A of the bottom electrode provides a uniform electric field during operation and increases the accuracy of the memory cell.

Referring back to FIG. 2, in operation 211 a resistive material layer, a capping layer, and a top electrode layer is deposited sequentially over the bottom electrode. The resistive material layer of the RRAM is a metal oxide, which may be hafnium oxide, zirconium oxide, aluminum oxide, nickel oxide, tantalum oxide, titanium oxide, and other known oxides used as a resistive material layer. The metal oxide may have a non-stoichiometric oxygen to metal ratio. Depending on the method of deposition, the oxygen to metal ratio and other process conditions may be tuned to achieve specific resistive material layer properties. For example, a set of conditions may yield a low 'forming' voltage and another set of conditions may yield a low 'read' voltage. The metal oxide may be deposited. In some embodiments, the metal oxide is a transition metal oxide. In other embodiments, the resistive material layer is a metal oxynitride.

The resistive material layer may be formed by a suitable technique, such as atomic layer deposition (ALD) with a precursor containing a metal and oxygen. Other chemical vapor deposition (CVD) techniques may be used. In another example, the resistive material layer may be formed by a physical vapor deposition (PVD), such as a sputtering process with a metallic target and with a gas supply of oxygen and optionally nitrogen to the PVD chamber. In yet another example, the resistive material layer may be formed an electron-beam deposition process. The resistive material layer may have a thickness ranging between about 20 angstroms and about 100 angstroms, or between about 40 angstroms and about 100 angstroms. Thicker resistive material layers result in higher forming voltage. However, a thin resistive material layer may be susceptible to current leakage if over etched and is more sensitivity to surface and thickness non-uniformity.

The capping layer of the RRAM over the resistive material layer is a metal. In various embodiments, the capping layer is a metal, for example, titanium, hathium, platinum, and tantalum. The capping layer may be deposited using a PVD process, a CVD, for example, an ALD process. The capping layer may have a thickness ranging between about 20 angstroms and about 150 angstroms, or between about 40 angstroms and about 80 angstroms.

The top electrode may be metal, metal-nitride, doped polysilicon or other suitable conductive material. For example, the top electrode may be tantalum nitride, titanium nitride, or platinum. The top electrode may be formed by PVD, CVD including ALD, or other suitable technique and has a thickness ranging between about 100 angstrom and about 500 angstroms. Alternatively, the top electrode includes other suitable conductive material to electrically connect the device to other portion of an interconnect structure for electrical routing.

In some embodiments, the layers are deposited in one system without breaking vacuum. Specifically, one or more of the layers may be deposited in the same chamber or each one in a different chamber on the same vacuum system. In other embodiments, more than one semiconductor processing system is used. FIG. 6 is the cross section diagram showing top electrode 605 over capping layer 603 over resistive material layer 601 over the bottom electrode 501.

Referring back to FIG. 2, in operation 213 the top electrode having a first width is patterned. The patterning includes a photolithography operation where a photoresist is deposited, a pattern is defined by exposing photoresist to a radiation, and developing the photoresist to create a photoresist pattern. The photoresist pattern is then used as an etch mask to protect desired portions of the RRAM structure. As shown in FIG. 7A, a portion of the top electrode layer and a portion of the capping layer are removed from the RRAM portion 301 of the wafer. All of the top electrode layer and capping layer are removed from the logic device portion 303 of the wafer. As shown in FIG. 7A, a top electrode 705 and a capping layer 703 having a same width remain over the resistive material layer 601. In some embodiments, the capping layer and the top electrode may be formed of the same material, but using different processes so as to vary a specific material property. In other embodiments, the capping layer is a metal and the top electrode layer is a metal nitride, for example, the capping layer may be titanium and the top electrode a tantalum nitride. The etch process stops when the resistive material layer 601 is reached. Techniques are available to detect the end of etching when a new material layer is reached so as to limit the amount of over etching. Because the resistive material layer 601 may be as thin as 40 angstroms, a large amount of over etching cannot be tolerated because the resistive material layer 601 would be removed or damaged.

Figure 7C:
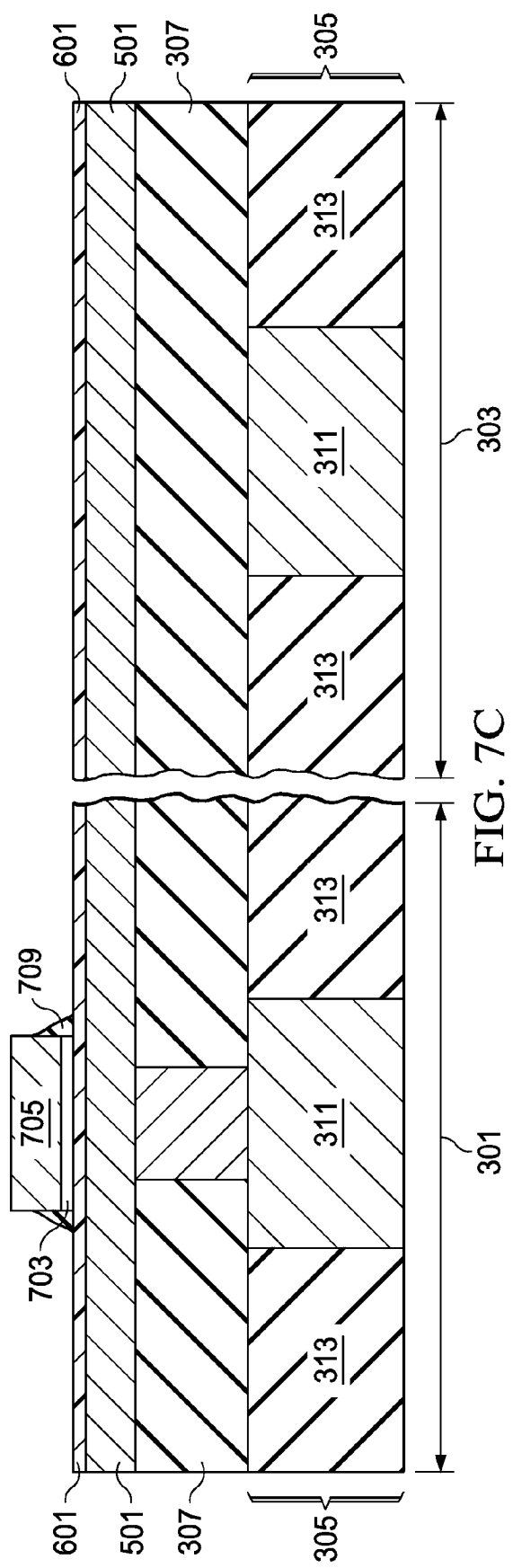

Referring back to FIG. 2, in operation 215 a spacer is formed around exposed portions of the capping layer. The spacer material may be silicon nitride, silicon oxynitride, and silicon oxide. The spacer material is a protective film covering the top and sidewalls of the top electrode and capping layer. As shown in FIG. 7A, the spacer material 707 is deposited over the resistive material layer in the logic device portion 303 as well as the RRAM portion 301. The spacer material 707 conformally coats the sidewalls of the top electrode 705 and the capping layer 703. The spacer is then etched to remove the field portions of the spacer material 707. Because of the shape of the conformal deposition, the spacer material 707 in the open regions such as the logic device portion 303 and over the top electrode 705 is removed during this etch. A small portion remains as spacer 709 as shown in FIG. 7C. Spacer 709 surrounds the capping layer 703 and protects the corner region of the capping layer 703 and resistive material layer 601 during subsequent etch operations. Spacer 709 has a height and a width as shown in FIG. 1A. The height and width of spacer 709 after etching may be tuned by adjusting deposition and etching parameters.

According to various embodiments, the spacer etching is performed without patterning first because the shape of the conformal spacer material can be etched to form the spacer 709. However, other spacer 709 shapes may be formed by patterning the spacer material first before etching. If a pattern is used, the spacer 709 may be formed of any shape. For example, the spacer 709 may include a portion over the top electrode and the top corners of the top electrode so as to further protect the RRAM structure during bottom electrode etch.

Figure 8:
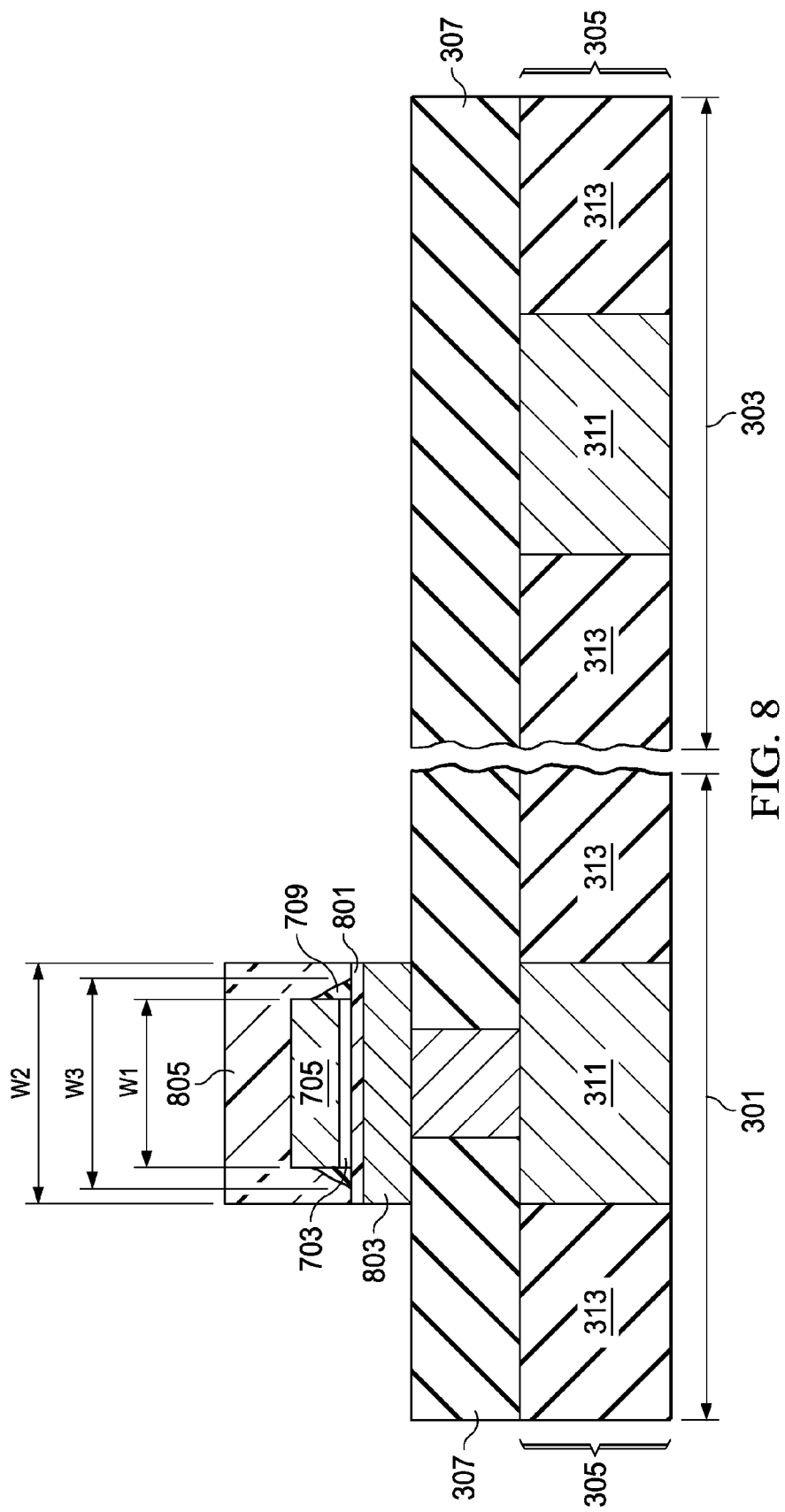

Referring back to FIG. 2, in operation 217 the bottom electrode is patterned. Just as the patterning of the top electrode, the patterning includes depositing, exposing, and developing the photoresist according to a photomask different form the one used in operation 213. In many embodiments, a hardmask material is deposited first over the top electrode and the capping layer, and the photoresist is used as an etch mask to define the hardmask first. As shown in FIG. 8, the photoresist/hardmask 805 (shown in dotted lines) covers the top electrode 705 and the capping layer 703 and has a width W2 larger than a width of the top electrode W1 and a width of the top electrode plus two spacers W3. The photoresist/hardmask 805 is used as an etchmask to remove a portion of the resistive material layer 601 and bottom electrode layer 501 of FIG. 7 to form the resistive material layer 801 and the bottom electrode 803. During the etching, the etchant also attacks the photoresist/hardmask 805 material such that by the time the unwanted portions of the bottom electrode are removed, the photoresist/hardmask 805 may be consumed as well. However, even if the photoresist/hardmask 805 is consumed, at least a portion of the spacer 709 remains to protect the capping layer 703/resistive material layer 801 corner from the etchant. After etching, the bottom electrode 803 and the resistive material layer 801 have a width W2 and only a portion of the photoresist/hardmask 805 remains. A portion of the spacer 709 may also be removed.

In some embodiments, a hardmask may be patterned over the spacer material layer and define essentially the bottom electrode without a separate spacer etch. In other words, all of the resistive material layer, capping layer, and top electrode of the RRAM structure are covered by the spacer material layer and the hardmask. A first etch removes a portion of the hardmask not covered by the photoresist pattern to expose spacer material layer. A second etch removes the excess spacer material layer 707 and resistive material layer. A third etch continues to remove uncovered portions of the bottom electrode layer to form the bottom electrode. In these embodiments, the photomask used for the bottom electrode also defines the spacer.

Referring back to FIG. 2, in operation 219 a second RRAM stop layer and a dielectric layer over the second RRAM stop layer is deposited. The second RRAM stop layer may be the same material as the first RRAM stop layer. The second RRAM stop layer may be silicon carbide, silicon oxynitride, silicon nitride, carbon doped silicon nitride or carbon doped silicon oxide. The second RRAM stop layer is selected to have a different etch selectivity than the overlying dielectric layer material. The second RRAM stop layer is deposited conformally over the RRAM structure using a chemical vapor deposition (CVD) process such as plasma enhanced (PE) CVD, high-density plasma (HDP) CVD, inductively-coupled-plasma (ICP) CVD, or thermal CVD. The conformity process window depends partially on the aspect ratio of the RRAM structure, which depends on the top electrode thickness. Thus in various embodiments, the top electrode thickness is not more than 500 angstroms.

The dielectric layer is deposited over the second RRAM stop layer. The dielectric layer may be the same material as the dielectric material 313 in the metal/dielectric layer 305 of FIG. 3. The dielectric layer may be silicon oxide, low-k silicon oxide such as a porous silicon oxide layer, or other commonly used interlayer dielectric (ILD) material. The dielectric layer completely fills the area between RRAM structures and covers the RRAM structures.

Referring back to FIG. 2, in operation 221 the dielectric layer is planarized. Depending on the method of deposition, the dielectric layer may have an uneven top surface. During subsequent contact etch, an uneven top surface may cause unwanted overetching and some portion and underetching in other portions. A CMP process is usually used to planarize the dielectric layer.

A top electrode via and a contact via are patterned in operation 223. The top electrode via extends from the top of the dielectric layer to the top electrode. Operation 223 may be performed in multiple steps: in a first step, a first pattern and etch stops on top of the second RRAM stop layer in the RRAM portion and in a second step, the second RRAM stop layer is etched through to the top electrode. The first step of pattern and etch is performed using known processes. The subsequent step of etching through the second RRAM stop layer may be performed together with contact etching in the logic device.

Then, a contact via is patterned in the dielectric layer for the logic portion. The contact via extends from the top of the dielectric layer to the metal features in the metal/dielectric layer below the first RRAM stop layer. A first pattern and etch stops on top of the first RRAM stop layer in the logic portion and subsequently, the first RRAM stop layer is etched through to the metal feature in the metal/dielectric layer. The first step of pattern and etch is performed using known processes. The subsequent step of etching through the first RRAM stop layer may be performed together with top electrode via etching in the RRAM portion.

Figure 9:
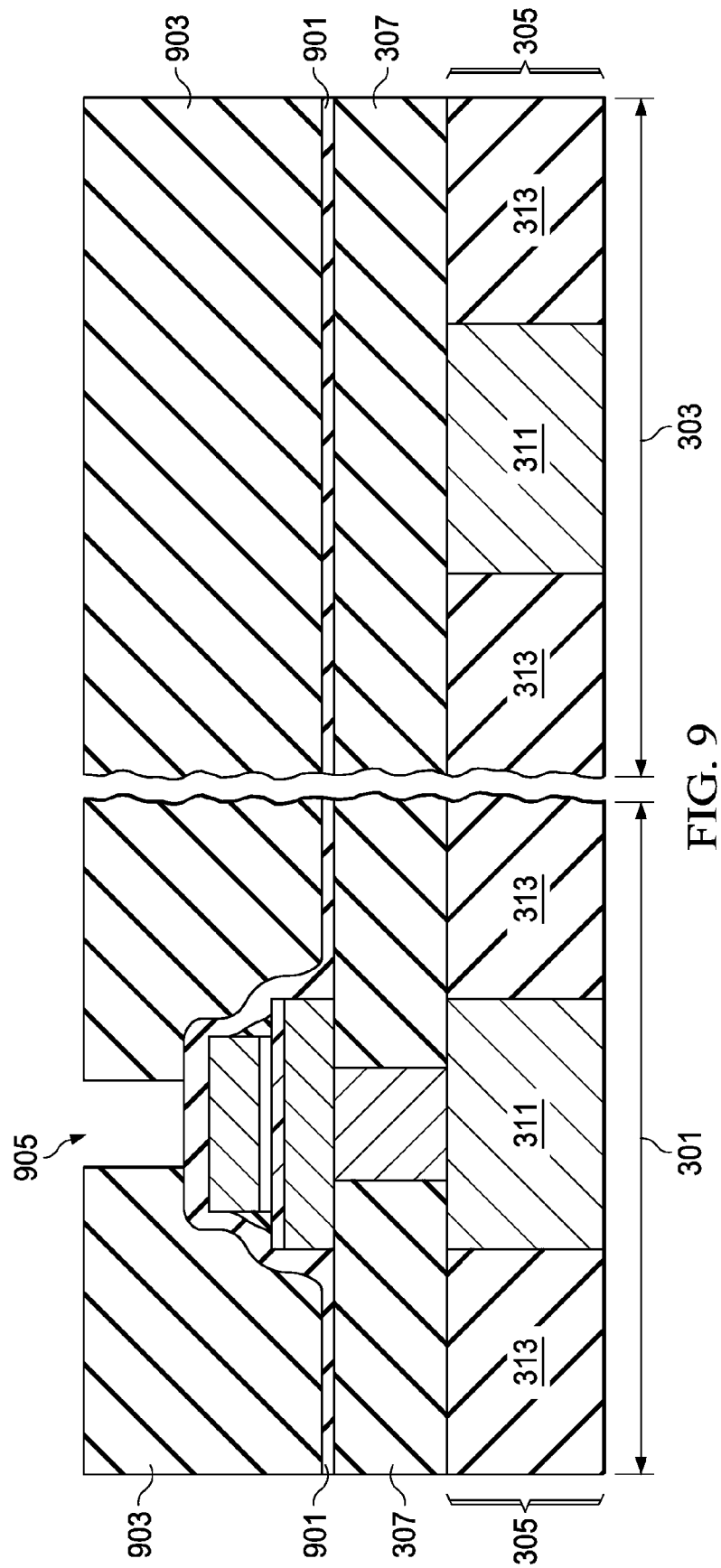

FIG. 9 is a cross section view after the top electrode via etch. The RRAM structure is conformally covered by second RRAM stop layer 901. A dielectric layer 903 fills the space between RRAM structures and covers the RRAM structure. A top electrode via 905 is etched in the dielectric layer 903 down to the second RRAM stop layer 901. In the embodiment as shown, the top electrode via 905 does not reach the top electrode; however, the top electrode via 905 is extended in a subsequent operation to the top electrode to form electrical connection with the RRAM structure.

Figure 10:
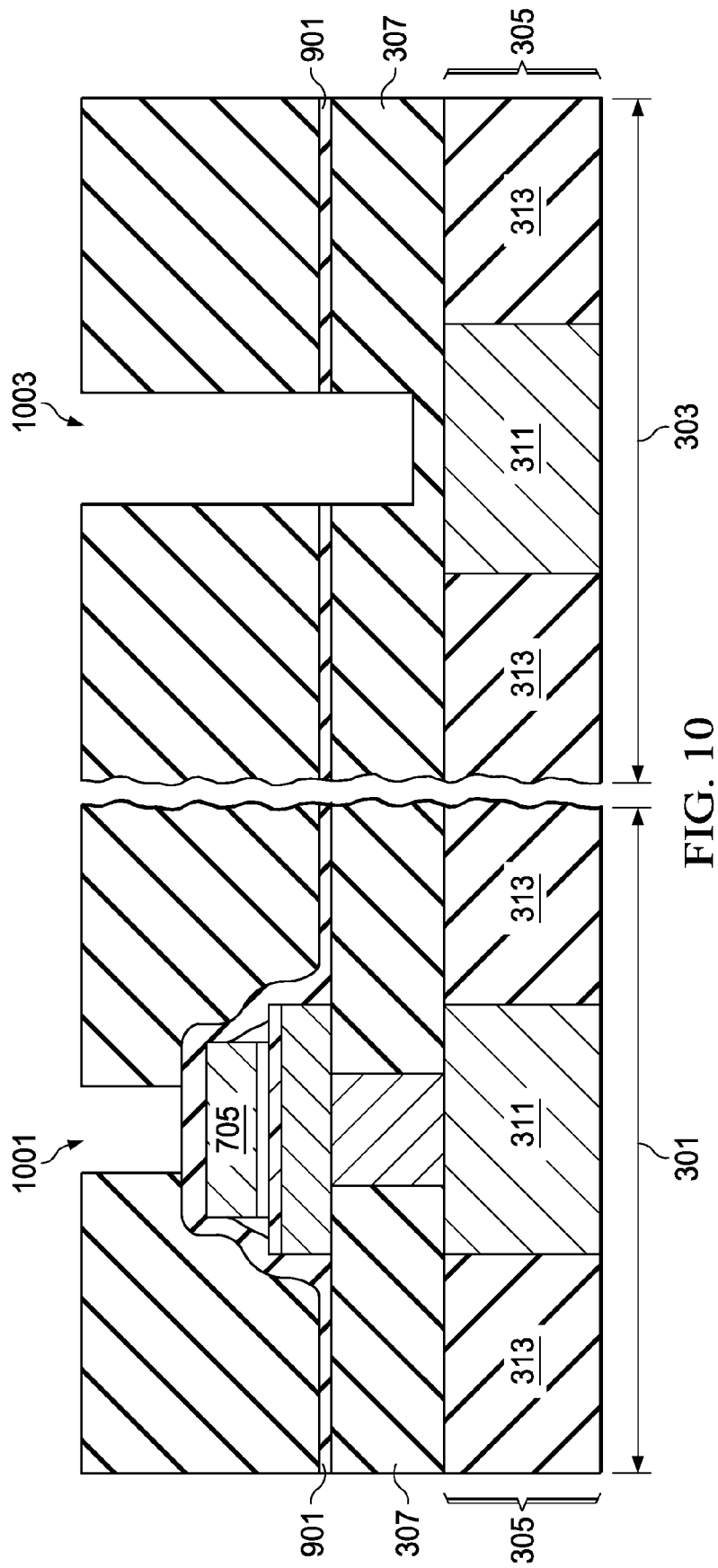

FIG. 10 is a cross sectional diagram including an RRAM portion 301 and a logic device portion 303 in an intermediate stage after the initial top electrode etch and contact via etch. In the RRAM portion 301 of FIG. 10, the top electrode via 1001 is formed, with a small portion of the second RRAM stop layer remaining at the bottom of the top electrode via 1001. In the logic device portion 303 of FIG. 10, the contact via 1003 is formed, with a small portion of the first RRAM stop layer 307 remaining at the bottom of the via contact 1003. Because the depths of the top electrode via 1001 and the contact via 1003 varies as well as the material composition etched, the top electrode etch and the contact via etch may be performed separately to ensure good process uniformity. To that end, two photomasks are used, one for patterning the top electrode via and one for patterning the contact via. The remaining portion of the second RRAM stop layer 901 in the RRAM portion 301 and the remaining portion of the first RRAM stop layer 307 in the logic device portion 303 may be removed at the same time to expose the top electrode 705 and metal feature 311.

Several photomasks used in the RRAM memory cell fabrication process are not used in the traditional CMOS fabrication process. The first additional photomask is one used for bottom electrode via patterning. The second additional photomask is one used for the top electrode patterning. The third additional photomask is one used for the bottom electrode patterning. Lastly, the fourth additional photomask is one used for the top electrode via patterning. Thus, the embedded RRAM of the present disclosure may be made with four additional photomasks as compared to traditional CMOS fabrication processes without RRAM structures. In some embodiments, one of the additional photomasks may be a mask that is used in another operation that happens to have a pattern that can be reused. In some embodiments, a reusable pattern may be one of an opposite photoresist. For example, in some embodiments, the first additional photomask may be reused for the four additional photomask by designing the RRAM structure such that the bottom electrode via and the top electrode via overlaps perfectly. In other embodiments, process parameter adjustments in one or more of the photolithography operations may allow the use of a photomask that does not overlap perfectly. For example, a positive photoresist may be used instead of a negative photoresist, or vice versa, to cause a different pattern when the exposure operation is performed at an angle.

Figure 11:
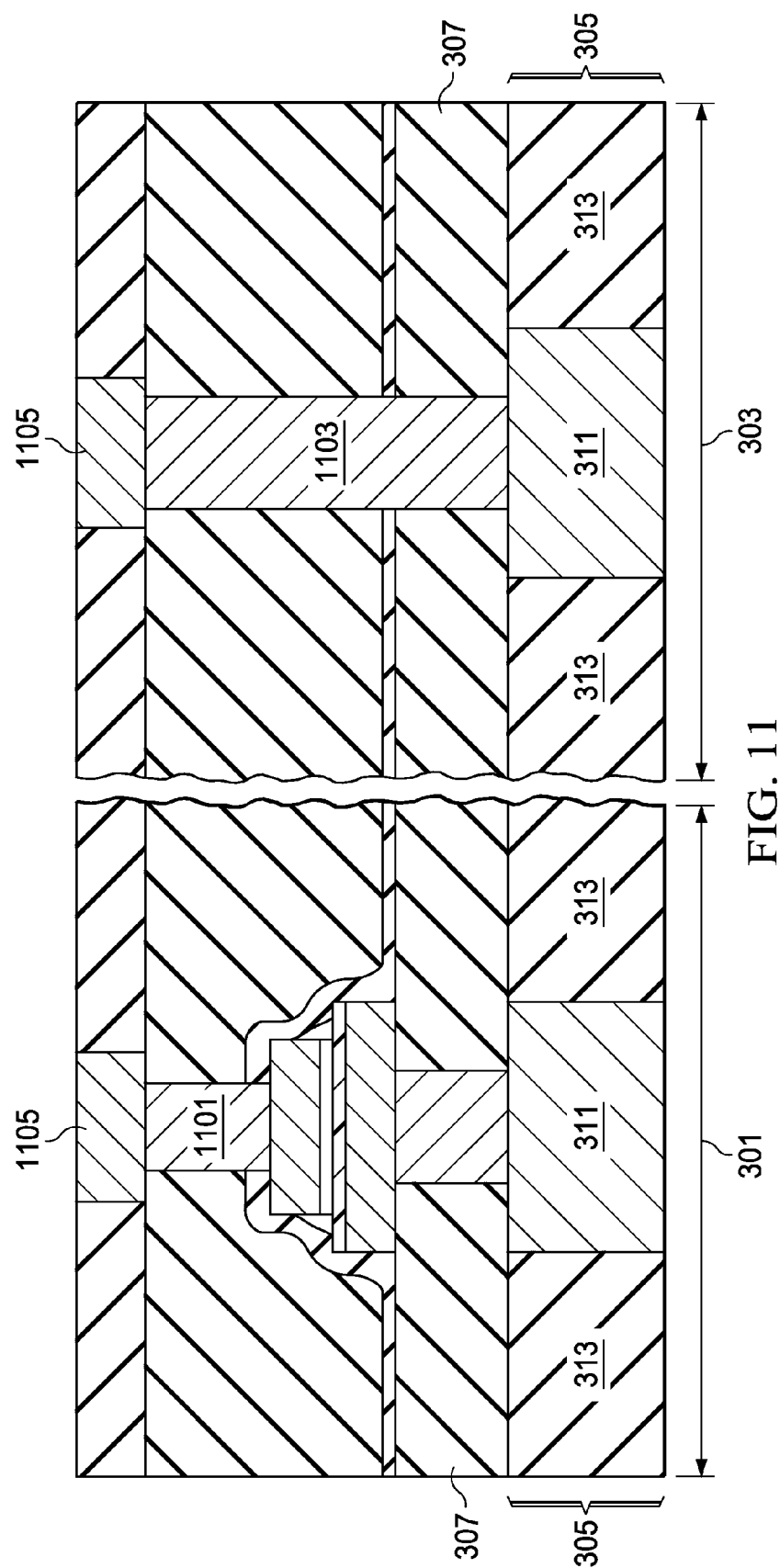

Referring back to FIG. 2, in operation 225, the top electrode via and the contact via are filled with a conductive material, usually a metal. The filling may also include one or more liner and barrier layers in additional a metal conductor. The liner and/or barrier may be conductive and deposited using CVD or PVD. The metal may be deposited using PVD or one of the plating methods, such as electrochemical plating. FIG. 11 is a cross section diagram of the partially fabricated device including a RRAM structure in a RRAM portion 301 and a logic portion 303. The top electrode via and the contact via of FIG. 10 are filled to form the top electrode contact 1101 and the contact 1103 of FIG. 11.

Referring back to FIG. 2, in operation 227 a second metal/dielectric layer is formed over the RRAM. The second metal/dielectric layer may be formed in a similar way as the first metal/dielectric layer under the RRAM structure. In some embodiments, excess metal from the top electrode via and the contact via filling are removed by planarization, new dielectric material deposited, metal line trenches patterned and etched in the new dielectric material, and metal lines filled to form the second metal/dielectric layer. In some embodiments, the metal line trenches are patterned and etched even before the top electrode via and the contact via are filled. When dimensions are such that the filling process permits, one filling operation can fill both the contacts and the metal trenches. The first metal/dielectric layer may be a fourth metal layer on the wafer and the second metal/dielectric layer may be a fifth metal layer on the wafer. After operation 227, the RRAM structure of FIG. 1 is complete in accordance with various embodiments of the present disclosure.

In one aspect, the present disclosure pertains to an RRAM cell. The RRAM cell includes a transistor; an RRAM structure, which includes a bottom electrode, a resistive material layer, a capping layer on the resistive material layer, a spacer surrounding the capping layer, and a top electrode; and a conductive material connecting the top electrode of the RRAM structure to a metal layer. The bottom electrode has a via portion and a top portion. The via portion of the bottom electrode is embedded in a first RRAM stop layer. The resistive material layer on the bottom electrode has a width that is same as a width of the top portion of the bottom electrode. The top electrode on the resistive material layer having a smaller width than the resistive material layer.

In another aspect, the present disclosure pertains to an RRAM cell having a transistor; an RRAM structure, and a conductive material connecting a top electrode of the RRAM structure to a metal layer. The RRAM structure includes a bottom electrode, a resistive material layer on the bottom electrode having a width that is same as a width of the bottom electrode, a capping layer, a top electrode on the capping layer, and a protective layer surrounding at least the capping layer. The top electrode and the capping layer have a same width smaller than a width of the bottom electrode. The protective layer is entirely disposed on the resistive material layer.

In yet another aspect, the present disclosure pertains to a method for making a RRAM cells. The method includes forming a transistor on a semiconductor substrate, depositing a bottom electrode layer, depositing a resistive material layer, depositing a capping layer, depositing a top electrode layer, forming a top electrode by patterning and etching the top electrode layer and the capping layer, forming a spacer around at least the capping layer, and forming a bottom electrode by patterning and etching the bottom electrode layer. The top electrode has a smaller width than the bottom electrode and the etching does not remove the spacer completely.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A resistive random access memory (RRAM) cell, comprising:
   a transistor;
   an RRAM structure electrically coupled to the transistor, the RRAM structure having
      a bottom electrode having a via portion and a top portion, wherein said via portion of the bottom electrode is embedded in a first RRAM stop layer;
      a resistive material layer on the bottom electrode having a width that is substantially the same as a width of the top portion of the bottom electrode;
      a capping layer on and physically contacting the resistive material layer having a smaller width than the resistive material layer;
      a spacer surrounding the capping layer;
      a top electrode on the resistive material layer having a width that is same as the capping layer and a thickness larger than the capping layer;
      a second RRAM stop layer having a first portion disposed over the first RRAM stop layer, the second RRAM stop layer having a second portion laterally surrounding the top electrode, the spacer, the resistive material layer, and the bottom electrode; and
      a dielectric layer over the first portion of the second RRAM stop layer and laterally surrounding the second portion of the second RRAM stop layer, the dielectric layer and the second RRAM stop layer differing in composition; and
   a conductive material connecting the top electrode of the RRAM structure to a metal layer.

2. The RRAM cell of claim 1, wherein the spacer comprises silicon nitride or silicon oxynitride.

3. The RRAM cell of claim 1, wherein the spacer comprises a same material as the first RRAM stop layer.

4. The RRAM cell of claim 1, wherein the capping layer comprises titanium, hafnium, platinum, or tantalum.

5. The RRAM cell of claim 1, wherein the spacer comprises a same material as the second RRAM stop layer.

6. The RRAM cell of claim 1, wherein the spacer also surrounds a portion of the top electrode.

7. A resistive random access memory (RRAM) cell, comprising:
   a transistor;
   an RRAM structure having
      a bottom electrode electrically coupled to the transistor;
      a resistive material layer on the bottom electrode having a width that is same as a width of the bottom electrode;
      a capping layer over the resistive material layer;
      a top electrode on the capping layer, the top electrode having a thickness larger than the capping layer;
      a protective layer surrounding at least the capping layer, wherein the top electrode and the capping layer have a same width smaller than a width of the bottom electrode and said protective layer is disposed on and physically contacts a surface of the resistive material layer facing away from the bottom electrode, and wherein a portion of the surface of the resistive material layer facing away from the bottom electrode is substantially free from the protective layer and the capping layer; and,
   a conductive material connecting the top electrode of the RRAM structure to a metal layer.

8. The RRAM cell of claim 7, further comprising three or more metal layers between the transistor and the RRAM structure.

9. The RRAM cell of claim 7, wherein the resistive material layer comprises hafnium oxide, zirconium oxide, aluminum oxide, nickel oxide, tantalum oxide or titanium oxide.

10. The RRAM cell of claim 7, wherein the spacer comprises silicon oxide.

11. A resistive element for a random access memory (RRAM) cell, comprising:
    a bottom electrode;
    a resistive material layer on the bottom electrode having a width that is same as a width of the bottom electrode;
    a capping layer on and physically contacting the resistive material layer;
    a top electrode on the capping layer;
    a protective layer surrounding at least the capping layer, wherein the top electrode and the capping layer have a same width smaller than a width of the bottom electrode and said protective layer is entirely disposed on the resistive material layer;
    a conductive material connecting the top electrode to a metal layer; and
    an RRAM stop layer conformally lining a portion of the conductive material, the top electrode, the protective layer, the resistive material layer, and the bottom electrode.

12. The resistive element of claim 11, wherein the protective layer comprises silicon nitride or silicon oxynitride.

13. The resistive element of claim 11, wherein the capping layer comprises titanium, hafnium, platinum, or tantalum.

14. The resistive element of claim 11, wherein the protective layer also surrounds a portion of the top electrode.

15. The resistive element of claim 11, wherein the resistive material layer comprises one or more oxides of hafnium, zirconium, aluminum, nickel, tantalum, tungsten, cobalt, ruthenium, zirconium, zinc, iron, tin, copper, silver, molybdenum, chromium or titanium.

16. The resistive element of claim 11, wherein the bottom electrode comprises one or more of gold, platinum, iridium iridium-tantalum alloy, indium-tin oxide, aluminum, tantalum, tungsten, ruthenium, copper or titanium, or any alloy, oxide, nitride, fluoride, carbide, boride or silicide of these.

17. The resistive element of claim 11, wherein the top electrode comprises one or more of gold, platinum, iridium iridium-tantalum alloy, indium-tin oxide, aluminum, tantalum, tungsten, ruthenium, copper or titanium, or any alloy, oxide, nitride, fluoride, carbide, boride or silicide of these.

18. The resistive element of claim 15 wherein the resistive material layer further comprising silicon oxide.

19. The resistive element of claim 11 wherein the RRAM stop layer, the bottom electrode, the resistive material layer, the capping layer, the top electrode and the protective layer are embedded in a dielectric material having an etch selectivity different from the RRAM stop layer.

20. The resistive element of claim 11, wherein the protective layer physically contacts the resistive material layer, and wherein a peripheral portion of a surface of the resistive material layer facing away from the bottom electrode is substantially free from the protective layer.

* * * * *